(12) United States Patent
Sugiura et al.

(10) Patent No.: US 12,129,392 B2
(45) Date of Patent: Oct. 29, 2024

(54) RESIN COMPOSITION FOR IMPRINTING

(71) Applicant: NAGASE CHEMTEX CORPORATION, Osaka (JP)

(72) Inventors: Yuki Sugiura, Hyogo (JP); Yohei Uetsuki, Hyogo (JP)

(73) Assignee: Nagase ChemteX Corporation, Osaka (JP)

( * ) Notice: Subject to any disclaimer, the term of this patent is extended or adjusted under 35 U.S.C. 154(b) by 415 days.

(21) Appl. No.: 17/627,051

(22) PCT Filed: Jul. 13, 2020

(86) PCT No.: PCT/JP2020/027278
§ 371 (c)(1),
(2) Date: Jan. 13, 2022

(87) PCT Pub. No.: WO2021/015044
PCT Pub. Date: Jan. 28, 2021

(65) Prior Publication Data
US 2022/0267638 A1    Aug. 25, 2022

(30) Foreign Application Priority Data

Jul. 24, 2019 (JP) ................ 2019-136038

(51) Int. Cl.

| | |
|---|---|
| *C09D 183/04* | (2006.01) |
| *C08K 3/22* | (2006.01) |
| *C08K 5/5419* | (2006.01) |
| *C08L 83/04* | (2006.01) |
| *B29C 59/02* | (2006.01) |
| *B29K 83/00* | (2006.01) |
| *B29K 105/16* | (2006.01) |
| *B29K 509/02* | (2006.01) |

(52) U.S. Cl.
CPC .............. *C09D 183/04* (2013.01); *C08K 3/22* (2013.01); *C08K 5/5419* (2013.01); *C08L 83/04* (2013.01); *B29C 59/022* (2013.01); *B29K 2083/00* (2013.01); *B29K 2105/162* (2013.01); *B29K 2509/02* (2013.01); *B29K 2995/0088* (2013.01); *C08K 2003/2237* (2013.01); *C08K 2003/2244* (2013.01)

(58) Field of Classification Search
CPC ...... C09D 183/04; C08K 3/22; C08K 5/5419; C08K 2003/2237; C08L 83/04; B29K 2083/00; B29K 2105/162; B29K 2509/02; B29K 2995/0088
See application file for complete search history.

(56) References Cited

U.S. PATENT DOCUMENTS

| | | | |
|---|---|---|---|
| 2005/0224452 A1 | 10/2005 | Spiess et al. | |
| 2008/0202163 A1 | 8/2008 | Okinaka et al. | |
| 2010/0097715 A1* | 4/2010 | Sakata | G03F 7/0002 264/293 |
| 2022/0025235 A1* | 1/2022 | Yoshitake | B32B 27/365 |

FOREIGN PATENT DOCUMENTS

| | | |
|---|---|---|
| CN | 109251338 | 1/2019 |
| JP | 2005-527110 | 9/2005 |
| JP | 2009-206197 | 9/2009 |
| JP | 2013-163786 | 8/2013 |
| JP | 2013163786 A * | 8/2013 |
| JP | 2016-160285 | 9/2016 |
| WO | 2008/105309 | 9/2008 |

OTHER PUBLICATIONS

[NPL-1] Kusakabe et al. (JP 2013-163786 A); Aug. 22, 2013 (EPO machine translation to English). (Year: 2013).*

* cited by examiner

*Primary Examiner* — Maria V Ewald
*Assistant Examiner* — Donald M Flores, Jr.
(74) *Attorney, Agent, or Firm* — HSML P.C.

(57) ABSTRACT

Provided is a resin composition for imprinting excellent in imprint properties and optical properties such as high refractive index and low haze. The invention relates to a resin composition for imprinting containing: (A) a polysiloxane resin represented by the following formula (1): $(R^1SiO_{3/2})_a(R^2{}_2SiO_{2/2})_b(R^3{}_3SiO_{1/2})_c(SiO_{4/2})_d$ wherein $R^1$, $R^2$, and $R^3$ are each independently a hydrogen atom, a hydroxy group, an alkoxy group, a C1-C12 hydrocarbon group, or a C1-C12 substituent having one or more crosslinkable functional groups, with at least one of $R^1$, $R^2$, or $R^3$ being a C1-C12 substituent having one or more crosslinkable functional groups, and when a plurality of $R^1$s, $R^2$s, or $R^3$s are present, they may be different from one another; and a, b, c, and d are numbers satisfying the following conditions: $0.001 \leq a \leq 1.00$, $0 \leq b \leq 0.999$, $0 \leq c \leq 0.30$, $0 \leq d \leq 0.30$, and $a+b+c+d=1.0$; and (B) a fine particulate inorganic oxide, wherein the ratio by weight of the sum of the polysiloxane resin (A) and optionally an alkoxysilane compound and a curable resin to the fine particulate inorganic oxide (B) is 0.2 to 2.5.

8 Claims, No Drawings

RESIN COMPOSITION FOR IMPRINTING

TECHNICAL FIELD

The present invention relates to a resin composition for imprinting.

BACKGROUND ART

Due to trend toward miniaturization of optical elements such as microlenses and diffractive optical elements and simplification of the production processes, electron beam lithography, which involves multiple processes such as exposure and development, has been replaced by imprinting techniques in which microfabrication at the submicron scale or smaller is performed by pressing a template onto a substrate to transfer the shape of the template to the substrate. Such imprinting techniques require resin materials that are processible by an imprinting process and have a high transparency and a high refractive index. In order to increase the refractive index, it is necessary to increase the amount of aromatic ring-containing compounds or highly refractive inorganic materials. To date, however, no composition has been developed which has a viscosity applicable to a UV imprinting process and which provides a cured product having good optical properties.

Patent Literature 1 discloses an imprinting composition containing a polysiloxane and silica fine particles. The examples therein, however, examine only compositions having a low silica content and also are based on the use of a bottom coat.

Patent Literature 2 discloses a composition containing a polysiloxane and fine particles and its use for imprinting. This literature, however, uses a cyclic polysiloxane and includes no specific evaluation on imprint properties.

Patent Literature 3 discloses an imprinting composition containing fine particles. This literature, however, uses an acrylic resin and silica and examines only compositions also having a low silica content in the examples.

CITATION LIST

Patent Literature

Patent Literature 1: JP 2005-527110 T
Patent Literature 2: JP 2016-160285 A
Patent Literature 3: WO 2008/105309

SUMMARY OF INVENTION

Technical Problem

The present invention aims to provide a resin composition for imprinting excellent in imprint properties and optical properties such as high refractive index and low haze.

Solution to Problem

As a result of research on imprint properties, the present inventers have found that both imprint properties and optical properties can be achieved by a resin composition containing a polysiloxane resin and a fine particulate inorganic oxide in which the amount of the fine particulate inorganic oxide is increased so that the ratio by weight of the sum of the polysiloxane resin (A) and optionally an alkoxysilane compound and a curable resin to the fine particulate inorganic oxide (B) is 0.2 to 2.5. This finding has led to the completion of the present invention.

Specifically, the present invention relates to a resin composition for imprinting, containing:
(A) a polysiloxane resin represented by the following formula (1):

$$(R^1SiO_{3/2})_a(R^2{}_2SiO_{2/2})_b(R^3{}_3SiO_{1/2})_c(SiO_{4/2})_d \quad (1)$$

wherein $R^1$, $R^2$, and $R^3$ are each independently a hydrogen atom, a hydroxy group, an alkoxy group, a C1-C12 hydrocarbon group, or a C1-C12 substituent having one or more crosslinkable functional groups, with at least one of $R^1$, $R^2$, or $R^3$ being a C1-C12 substituent having one or more crosslinkable functional groups, and when a plurality of $R^1$s, $R^2$s, or $R^3$s are present, they may be different from one another; and
a, b, c, and d are numbers satisfying the following conditions: $0.001 \leq a \leq 1.00$, $0 \leq b \leq 0.999$, $0 \leq c \leq 0.30$, $0 \leq d \leq 0.30$, and $a+b+c+d=1.0$; and
(B) a fine particulate inorganic oxide,
wherein a ratio by weight of a sum of the polysiloxane resin (A) and optionally an alkoxysilane compound and a curable resin to the fine particulate inorganic oxide (B) is 0.2 to 2.5.

Preferably, the crosslinkable functional groups in the C1-C12 substituent are each a (meth)acrylic group, a (meth)acryloxy group, a vinyl group, or an epoxy group.

Preferably, the polysiloxane resin (A) has a weight average molecular weight of 1000 to 5000.

Preferably, the fine particulate inorganic oxide (B) has an average dispersed particle size of 10 to 70 nm.

Preferably, the ratio by weight of a sum of the polysiloxane resin (A) and optionally an alkoxysilane compound and a curable resin to the fine particulate inorganic oxide (B) is 0.25 to 1.

Preferably, the fine particulate inorganic oxide (B) is zirconium oxide or titanium oxide.

The present invention also relates to an imprinted substrate including: a substrate; and a projection or recess formed from a cured product of the resin composition for imprinting.

The present invention also relates to a method of producing an imprinted substrate, the method including: coating a substrate with the resin composition for imprinting; and patterning the coated substrate by nano imprinting.

Advantageous Effects of Invention

The resin composition for imprinting of the present invention in which the ratio by weight of the sum of a polysiloxane resin (A) and optionally an alkoxysilane compound and a curable resin to a fine particulate inorganic oxide (B) is 0.2 to 2.5 is excellent in imprint properties and optical properties.

DESCRIPTION OF EMBODIMENTS

«Resin Composition for Imprinted Substrate»

The resin composition for imprinting of the present invention contains:
(A) a polysiloxane resin represented by the following formula (1):

$$(R^1SiO_{3/2})_a(R^2{}_2SiO_{2/2})_b(R^3{}_3SiO_{1/2})_c(SiO_{4/2})_d \quad (1)$$

wherein $R^1$, $R^2$, and $R^3$ are each independently a hydrogen atom, a hydroxy group, an alkoxy group, a C1-C12 hydrocarbon group, or a C1-C12 substituent having one or more crosslinkable functional groups, with at least one of $R^1$, $R^2$, or $R^3$ being a C1-C12 substituent having one or more crosslinkable functional groups, and when a plurality of $R^1$s, $R^2$s, or $R^3$s are present, they may be different from one another; and a, b, c, and d are numbers satisfying the following conditions: $0.001 \leq a \leq 1.00$, $0 \leq b \leq 0.999$, $0 \leq c \leq 0.30$, $0 \leq d \leq 0.30$, and $a+b+c+d=1.0$; and (B) a fine particulate inorganic oxide, wherein the ratio by weight of the sum of the polysiloxane resin (A) and optionally an alkoxysilane compound and a curable resin to the fine particulate inorganic oxide (B) is 0.2 to 2.5.

<(A) Polysiloxane Resin>

The polysiloxane resin (A) is represented by the following formula (1):

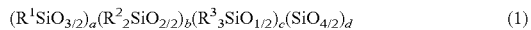

$$(R^1SiO_{3/2})_a(R^2_2SiO_{2/2})_b(R^3_3SiO_{1/2})_c(SiO_{4/2})_d \quad (1)$$

wherein $R^1$, $R^2$, and $R^3$ are each independently a hydrogen atom, a hydroxy group, an alkoxy group, a C1-C12 hydrocarbon group, or a C1-C12 substituent having one or more crosslinkable functional groups, with at least one of $R^1$, $R^2$, or $R^3$ being a C1-C12 substituent having one or more crosslinkable functional groups, and when a plurality of $R^1$s, $R^2$s, or $R^3$s are present, they may be different from one another; and a, b, c, and d are numbers satisfying the following conditions: $0.001 \leq a \leq 1.00$, $0 \leq b \leq 0.999$, $0 \leq c \leq 0.30$, $0 \leq d \leq 0.30$, and $a+b+c+d=1.0$.

$R^1$, $R^2$, and $R^3$ are each independently a hydrogen atom, a hydroxy group, an alkoxy group, a C1-C12 hydrocarbon group, or a C1-C12 substituent having one or more crosslinkable functional groups. The term "hydrocarbon group" refers to a group consisting of carbon and hydrogen, and examples include aliphatic hydrocarbon groups and aromatic hydrocarbon groups. The term "C1-C12 substituent having one or more crosslinkable functional groups" refers to a substituent obtained by replacing one or more hydrogen atoms in a C1-C12 hydrocarbon group by crosslinkable functional group(s). The number of carbon atoms of the hydrocarbon group is preferably 1 to 6. When a plurality of $R^1$s, $R^2$s, or $R^3$s are present, they may be different from one another. Moreover, at least one of $R^2$, $R^2$, or $R^3$ needs to be a C1-C12 substituent having one or more crosslinkable functional groups. Examples of the crosslinkable functional groups include a (meth)acrylic group, a (meth)acryloxy group, a vinyl group, and an epoxy group.

Preferably, a is 0.1 to 1. Preferably, b is 0 to 0.7. Preferably, c is 0 to 0.2. Preferably, d is 0 to 0.1. When these numbers fall within the respective ranges, the polysiloxane resin may be highly compatible with a dispersion of inorganic fine particles, resulting in a composition having good curability.

The polysiloxane resin may be prepared by any method such as hydrolysis and condensation of an alkoxysilane.

(Alkoxysilane)

The alkoxysilane may be a compound represented by the following formula (a):

$$SiR_4 \quad (a)$$

wherein the four Rs are each a hydrogen atom, a hydroxy group, an alkoxy group, an aliphatic hydrocarbon group, or an aromatic hydrocarbon group, with at least one of the four Rs being an alkoxy group. Moreover, the alkoxy group, the aliphatic hydrocarbon group, and the aromatic hydrocarbon group may each have a substituent.

The compound is referred to as a monoalkoxysilane when one of the four Rs is an alkoxy group, a dialkoxysilane when two of the four Rs are alkoxy groups, a trialkoxysilane when three of the four Rs are alkoxy groups, and a tetraalkoxysilane when the four Rs are alkoxy groups. The alkoxysilane used in the preparation of the polysiloxane resin may be any of the monoalkoxysilane, the dialkoxysilane, the trialkoxysilane, and the tetraalkoxysilane.

Examples of the alkoxy group include C1-C4 alkoxy groups such as a methoxy group and an ethoxy group. Examples of the aliphatic hydrocarbon group include C1-C20 alkyl groups such as a methyl group, an ethyl group, a propyl group, an isopropyl group, a butyl group, a s-butyl group, and a t-butyl group. Examples of the aromatic hydrocarbon group include aryl groups such as a phenyl group, a tolyl group, and a xylyl group; and aralkyl groups such as a benzyl group.

Examples of the substituent present in the aliphatic hydrocarbon group or the aromatic hydrocarbon group include crosslinkable functional groups such as a (meth)acrylic group, a (meth)acryloxy group, a vinyl group, and an epoxy group, a primary amino group, a thiol group, and a styryl group.

Examples of the alkoxysilane include aliphatic hydrocarbon group-containing alkoxysilanes such as methyltrimethoxysilane, dimethyldimethoxysilane, dimethyldiethoxysilane, and methoxytrimethylsilane; aromatic hydrocarbon group-containing alkoxysilanes such as phenyltrimethoxysilane, diphenyldimethoxysilane, diphenyldiethoxysilane, methylphenyldimethoxysilane, and methylphenyldiethoxysilane; amino group-containing alkoxysilanes such as 3-aminopropyltrimethoxysilane, 3-aminopropyltriethoxysilane, N-2-(aminoethyl)-3-aminopropyltrimethoxysilane, 2-aminophenyltrimethoxysilane, 3-aminophenyltrimethoxysilane, 3-aminopropylmethyldimethoxysilane, 3-aminopropylmethyldiethoxysilane, 3-aminopropyldimethylmethoxysilane, and 3-aminopropyldimethylethoxysilane; (meth)acrylic group-containing alkoxysilanes such as 3-methacryloxypropyltrimethoxysilane and 3-methacryloxypropylmethyldimethoxysilane; vinyl group-containing alkoxysilanes such as vinyltrimethoxysilane, vinyltriethoxysilane, vinyltributoxysilane, vinylmethyldimethoxysilane, vinyltrimethoxysilane, vinyltriethoxysilane, vinyltributoxysilane, and vinylmethyldimethoxysilane; and epoxy group-containing alkoxysilanes such as β-glycidoxyethyltrimethoxysilane, β-glycidoxyethyltriethoxysilane, γ-glycidoxypropyltrimethoxysilane, γ-glycidoxypropyltriethoxysilane, β-(3,4-epoxycyclohexyl)ethyltrimethoxysilane, β-(3,4-epoxycyclohexyl)ethyltriethoxysilane, γ-glycidoxypropylmethyldimethoxysilane, and γ-glycidoxypropylmethyldiethoxysilane.

In the hydrolysis and condensation, an alkoxysilane having a crosslinkable functional group and optionally an alkoxysilane having no crosslinkable functional group may be used in combination. A hydrolyzable silane may also be used in combination such as dimethylsilanediol, diisopropylsilanediol, diisobutylsilanediol, di-n-propylsilanediol, di-n-butylsilanediol, di-t-butylsilanediol, phenylmethylsilanediol, dicyclohexylsilanediol, ethylsilanetriol, or diphenylsilanediol.

(Hydrolysis and Condensation)

The hydrolysis and condensation may preferably be performed under the following temperature and time conditions: at 30 to 120° C. for 1 to 24 hours, more preferably at 40 to 90° C. for 2 to 12 hours, still more preferably at 45 to 80° C. for 3 to 8 hours.

The hydrolysis and condensation cause the alkoxy group in the alkoxysilane to form a siloxane bond, producing a polysiloxane resin in which some unreacted alkoxy groups or some hydroxy groups formed by hydrolysis of alkoxy groups may remain.

The hydrolysis and condensation may be carried out using a catalyst. Examples of the catalyst include basic catalysts and acidic catalysts. Examples of the basic catalysts include tetramethylammonium hydroxide, tetraethylammonium hydroxide, tetrabutylammonium hydroxide, benzyltrimethylammonium hydroxide, benzyltriethylammonium hydroxide, potassium t-butoxide, sodium hydrogen carbonate, sodium carbonate, barium hydroxide, sodium hydroxide, and potassium hydroxide. Among these, tetramethylammonium hydroxide, potassium t-butoxide, sodium hydrogen carbonate, sodium carbonate, barium hydroxide, sodium hydroxide, and potassium hydroxide are preferred as they have high catalyst activity. Examples of the acidic catalysts include hydrochloric acid, sulfuric acid, nitric acid, acetic acid, phosphoric acid, boric acid, trifluoroacetic acid, trifluoromethanesulfonic acid, and p-toluenesulfonic acid.

The hydrolysis and condensation may be carried out using a solvent as necessary. Examples of such solvents include water; alcohols such as methanol and ethanol; ethers such as tetrahydrofuran (THF); glycol ethers such as ethylene glycol monomethyl ether, ethylene glycol monoethyl ether, ethylene glycol monobutyl ether, ethylene glycol dimethyl ether, diethylene glycol monomethyl ether, diethylene glycol monoethyl ether, diethylene glycol dimethyl ether, diethylene glycol diethyl ether, and diethylene glycol monobutyl ether; alkylene glycol monoalkyl ether acetates such as methyl cellosolve acetate, ethyl cellosolve acetate, butyl cellosolve acetate, propylene glycol methyl ether acetate (PGMEA), and 3-methoxybutyl-1-acetate; aromatic hydrocarbons such as toluene and xylene; and ketones such as methyl ethyl ketone, methyl isobutyl ketone (MIBK), methyl amyl ketone, and cyclohexanone, with ketones, alkylene glycol monoalkyl ether acetates, and aromatic hydrocarbons being preferred. Each of these solvents may be used alone, or two or more of these may be used in admixture.

The solvent content is preferably 50 to 500 parts by mass, more preferably 100 to 400 parts by mass, per 100 parts by mass of the alkoxysilane.

The weight average molecular weight of the polysiloxane resin (A) is not limited, and is preferably 1000 to 5000, more preferably 1300 to 3700. A weight average molecular weight falling within the range indicated above tends to lead to excellent curability and therefore excellent optical properties and imprint properties.

<(B) Fine Particulate Inorganic Oxide>

Non-limiting examples of the fine particulate inorganic oxide (B) include metal oxides each containing one metal element and composite metal oxides each containing two or more metal elements. Examples of the metal oxides each containing one metal element include zirconium oxide ($ZrO_2$), titanium oxide ($TiO_2$), silicon oxide ($SiO_2$), aluminum oxide ($Al_2O_3$), iron oxide ($Fe_2O_3$, $FeO$, $Fe_3O_4$), copper oxide ($CuO$, $Cu_2O$), zinc oxide ($ZnO$), yttrium oxide ($Y_2O_3$), niobium oxide ($Nb_2O_5$), molybdenum oxide ($MoO_3$), indium oxide ($In_2O_3$, $In_2O$), tin oxide ($SnO_2$), tantalum oxide ($Ta_2O_5$), tungsten oxide ($WO_3$, $W_2O_5$), lead oxide ($PbO$, $PbO_2$), bismuth oxide ($Bi_2O_3$), cerium oxide ($CeO_2$, $Ce_2O_3$), antimony oxide ($Sb_2O_5$), and germanium oxide ($GeO_2$, $GeO$). These fine particulate inorganic oxides may be used alone or in combinations of two or more. The fine particulate inorganic oxide is preferably zirconium oxide or titanium oxide because they are easily available and can easily adjust optical properties such as refractive index.

Examples of the composite metal oxides each containing two or more metal elements include titanates such as barium titanate, titanium/silicon composite oxide, and yttrium-stabilized zirconia. Such composite oxides include not only compounds or solid solutions containing multiple elements but also those having a core-shell structure in which the periphery of a metal oxide fine particle as the core is covered by a metal oxide containing another metal element, and those having a multicomponent dispersion structure, e.g., in which one metal oxide fine particle contains multiple other metal oxide fine particles dispersed therein.

The fine particulate inorganic oxide may have any primary particle size. The primary particle size is preferably 1 to 50 nm, more preferably 5 to 30 nm. A fine particulate inorganic oxide with a primary particle size of smaller than 1 nm has a large specific surface area and a high cohesive energy, so that its dispersion stability may be difficult to maintain. Moreover, a fine particulate inorganic oxide with a primary particle size of greater than 50 nm may cause intense light scattering in the thin film or molded product, so that a high level of transparency may not be maintained. The primary particle size can be determined with an electron microscope such as SEM or TEM or converted from the specific surface area.

The fine particulate inorganic oxide may be dispersed in any solvent in advance. Non-limiting examples of the solvent include alcohols such as methanol, ethanol, 2-propanol, and butanol; esters such as ethyl acetate, butyl acetate, ethyl lactate, propylene glycol monomethyl ether acetate, and γ-butyrolactone; ethers such as diethyl ether, ethylene glycol monomethyl ether (methyl cellosolve), ethylene glycol monoethyl ether (ethyl cellosolve), ethylene glycol monobutyl ether (butyl cellosolve), diethylene glycol monomethyl ether, and diethylene glycol monoethyl ether; ketones such as acetone, methyl ethyl ketone, methyl isobutyl ketone, acetylacetone, and cyclohexanone; aromatic hydrocarbons such as benzene, toluene, xylene, and ethylbenzene; and amides such as dimethylformamide, N,N-dimethylacetamide, and N-methylpyrrolidone. These solvents may be used alone or in combinations of two or more. The solvent and the fine particulate metal oxide may be added at any ratio, preferably at 30:70 to 90:10.

A dispersant may be added in order to disperse the fine particulate inorganic oxide. The dispersant may be any dispersant that can disperse it in a solvent. Examples include polyacrylic acid dispersants, polycarboxylic acid dispersants, phosphoric acid dispersants, and silicone dispersants.

An example of a polyacrylic acid dispersant is sodium polyacrylate. Commercial products include ARON series (Toagosei Co., Ltd.) and SHALLOL series (DKS Co. Ltd.).

Examples of polycarboxylic acid dispersants include acidic ones not neutralized with cations, and polycarboxylic acid ammonium salts. Commercial products include AH-103P (DKS Co. Ltd.); SN-DISPERSANT 5020 and SN-DISPERSANT 5468 (San Nopco Limited); POIZ 532A and POIZ 2100 (Kao Corporation); and MALIALIM AKM-0531, MALIALIM AKM-1511-60, MALIALIM HKM-50A, and MALIALIM HKM-150A (NOF Corporation).

Examples of phosphoric acid dispersants include polyoxyethylene alkyl ether phosphates. Commercial products include PHOSPHANOL RA-600 and ML-220 (Toho Chemical Industry Co., Ltd.), and DISPARLON PW-36 (Kusumoto Chemicals, Ltd.).

Examples of silicone dispersants include modified silicone oils. Commercial products include ES-5612 (DuPont Toray Specialty Materials K.K.).

The amount of the dispersant added is preferably 0.25 to 30 parts by weight, more preferably 0.25 to 8 parts by weight, still more preferably 0.5 to 7 parts by weight, most preferably 1 to 5 parts by weight, per 100 parts by weight of the fine particulate inorganic oxide. When the amount is less than 0.25 parts by weight, the fine particulate inorganic oxide may not be sufficiently dispersed. When the amount is more than 30 parts by weight, the processed product such as thin film or molded product may have lower light or heat resistance, and the properties of the fine particulate inorganic oxide may not be sufficiently provided.

An alkoxysilane compound may be added in order to increase compatibility between the fine particulate inorganic oxide and the polysiloxane resin during mixing of the dispersion and the polysiloxane resin. When the dispersion is exposed to acidic or alkaline conditions, the hydroxy groups on the surface of the fine particulate inorganic oxide may react with the alkoxysilane compound so that the fine particulate inorganic oxide is surface treated.

The alkoxysilane compound is preferably a compound represented by the following formula (I):

$$SiR_4 \qquad (I)$$

wherein each R is a hydrogen atom, a hydroxy group, a C1-C4 alkoxy group, an optionally substituted alkyl group, or an optionally substituted phenyl group, with at least one of the four Rs being a C1-C4 alkoxy group or a hydroxy group.

Specific examples of the alkoxysilane compound include trialkoxysilanes such as 3-methacryloxypropyltrimethoxysilane, 3-glycidoxypropyltrimethoxysilane, phenyltrimethoxysilane, vinyltrimethoxysilane, 2-(3,4-epoxycyclohexyl)ethyltrimethoxysilane, p-styryltrimethoxysilane, 3-acryloxypropyltrimethoxysilane, N-2-(aminoethyl)-3-aminopropylmethyldimethoxysilane, 3-ureidopropyltriethoxysilane, 3-mercaptopropylmethyldimethoxysilane, bis(triethoxysilylpropyl)tetrasulfide, and 3-isocyanatopropyltriethoxysilane; and dialkoxysilanes such as 3-methacryloxypropylmethyldimethoxysilane, dimethyldimethoxysilane, and diphenyldimethoxysilane. These may be used alone or in combinations of two or more. Preferred among these are trialkoxysilanes, with 3-methacryloxypropyltrimethoxysilane, 3-glycidoxypropyltrimethoxysilane, and phenyltrimethoxysilane being more preferred.

The amount of the alkoxysilane compound added is preferably 4 to 50 parts by weight, more preferably 6 to 38 parts by weight, still more preferably 8 to 20 parts by weight, per 100 parts by weight of the fine particulate inorganic oxide. When the amount is less than 4 parts by weight, the fine particulate inorganic oxide may be difficult to uniformly disperse. When the amount is more than 50 parts by weight, the inorganic oxide may not be highly loaded, failing to obtain target properties.

When the dispersion contains a dispersant and an alkoxysilane compound, the ratio by weight of the dispersant to the alkoxysilane compound is preferably 20:80 to 5:95, more preferably 18:82 to 7:93, still more preferably 18:82 to 9:91. When the ratio by weight is less than 80 of the alkoxysilane compound to 20 of the dispersant, the dispersant may be excessive, possibly causing the processed product such as thin film or molded product to have deteriorated properties. When the ratio by weight is more than 95 of the alkoxysilane compound to 5 of the dispersant, it may be difficult to prepare a uniform dispersion.

The fine particulate inorganic oxide in the resin composition for imprinting preferably has an average particle size of 10 to 70 nm, more preferably 10 to 50 nm. For an average particle size of smaller than 10 nm, it is necessary to use particles having a small primary particle size, which may be difficult to disperse. Moreover, when the average particle size is greater than 70 nm, the cured product such as thin film or molded product may become cloudy. The average particle size can be measured using an apparatus based on dynamic light scattering, laser diffraction, or other methods.

The ratio by weight of the sum of the polysiloxane resin (A) and optionally the alkoxysilane compound and a curable resin to the fine particulate inorganic oxide (B) is 0.2 to 2.5, preferably 0.25 to 1.0. Also, the ratio by weight of the sum of the polysiloxane resin (A) and optionally the alkoxysilane compound to the fine particulate inorganic oxide (B) is preferably 0.2 to 2.5, more preferably 0.25 to 1.0. When the ratios by weight fall within the respective ranges indicated above, excellent imprint properties can be obtained and the optical properties required for optical elements can be sufficiently satisfied.

Moreover, the amount of the fine particulate inorganic oxide (B) is preferably 25 to 80 wt %, more preferably 30 to 80 wt %, still more preferably 35 to 75 wt % of the solids content of the resin composition for imprinting. When the amount falls within the range indicated above, excellent imprint properties can be obtained and the optical properties required for optical elements can be sufficiently satisfied.

<Optional Component>

The resin composition for imprinting of the present invention may optionally contain additional components in addition to the components above. Examples of such additional components include curable resins other than polysiloxane resins, such as epoxy resins, acrylates, and melamine, thermoplastic resins such as acrylic resins, polyester resins, urethane resins, and polyolefin resins, polymerization initiators, levelling agents, surfactants, photosensitizers, defoamers, neutralizers, antioxidants, release agents, ultraviolet absorbers, and solvents.

Examples of the curable resins include epoxy resins including bisphenol A epoxy resins, bisphenol F epoxy resins, phenol novolac epoxy resins, tetrakis(hydroxyphenyl)ethane or tris(hydroxyphenyl)methane epoxy resins (which are polyfunctional epoxy resins containing a number of benzene rings), biphenyl epoxy resins, triphenol methane epoxy resins, naphthalene epoxy resins, ortho novolac epoxy resins, dicyclopentadiene epoxy resins, aminophenol epoxy resins, fluorene epoxy resins, alicyclic epoxy resins, and silicone epoxy resins; acrylates such as 2-hydroxyethyl (meth)acrylate, 2-hydroxypropyl (meth)acrylate, 3-hydroxypropyl (meth)acrylate, trimethylolpropane triacrylate, ditrimethylolpropane tetraacrylate, pentaerythritol triacrylate, pentaerythritol tetraacrylate, dipentaerythritol pentaacrylate, dipentaerythritol hexaacrylate, alkyl-modified dipentaerythritol pentaacrylate, ethylene glycol (meth)acrylate, diethylene glycol di(meth)acrylate, triethylene glycol di(meth)acrylate, tetraethylene glycol di(meth)acrylate, tetramethylene glycol di(meth)acrylate, polyethylene glycol di(meth)acrylate, glycerol tri(meth)acrylate, and 9,9-bis(4-(meth)acryloyloxyphenyl)fluorene; aliphatic epoxy compounds such as ethylene glycol diglycidyl ether, propylene glycol diglycidyl ether, 1,4-butanediol diglycidyl ether, neopentyl glycol diglycidyl ether, and 1,6-hexanediol diglycidyl ether; fluorene-containing epoxy compounds such as 9,9-bis(4-glycidyloxyphenyl)fluorene; and melamine.

The amount of the curable resin added is preferably 0 to 100 parts by weight, more preferably 0.1 to 50 parts by weight, per 100 parts by weight of the fine particulate inorganic oxide. The amount of the curable resin is preferably 0 to 50000 parts by weight, more preferably 0 to 10000 parts by weight, still more preferably 0 to 1000 parts by weight, particularly preferably 1 to 100 parts by weight, most preferably 5 to 50 parts by weight, per 100 parts by weight of the polysiloxane resin (A).

The amount of the polysiloxane resin (A) added is preferably 0.01 to 500 parts by weight, more preferably 0.1 to 300 parts by weight, still more preferably 0.2 to 200 parts by weight, per 100 parts by weight of the fine particulate inorganic oxide.

Examples of the polymerization initiators include photo radical polymerization initiators and thermal radical polymerization initiators. These polymerization initiators may be used alone, or two or more polymerization initiators may be used in combination; for example, two or more photo radical polymerization initiators or two or more thermal radical polymerization initiators may be combined, or photo radical polymerization initiator(s) and thermal radical polymerization initiator(s) may be combined.

Examples of the photo radical polymerization initiators include 2,2-dimethoxy-1,2-diphenylethan-1-one, 1-hydroxycyclohexyl phenyl ketone, 2-hydroxy-2-methyl-1-phenyl-propan-1-one, 1-[4-(2-hydroxyethoxy)-phenyl]-2-hydroxy-2-methyl-1-propan-1-one, 2-hydroxy-1-{4-[4-(2-hydroxy-2-methyl-propionyl)-benzyl]phenyl)-2-methyl-propan-1-one, 2-methyl-1-(4-methylthiophenyl)-2-morpholinopropan-1-one, 2-benzyl-2-dimethylamino-1-(4-morpholinophenyl)-butanone-1, and bis(2,4,6-trimethylbenzoyl)-phenylphosphine oxide.

Examples of the thermal radical polymerization initiators include dicumyl peroxide, di-t-butyl peroxide, 2,5-dimethyl-2,5-bis(t-butylperoxy)hexane, 2,5-dimethyl-2,5-bis(t-butylperoxy)hexyne-3,1,3-bis(t-butylperoxyisopropyl)benzene, 1,1-bis(t-butylperoxy)valerate, benzoyl peroxide, t-butylperoxy benzoate, acetyl peroxide, isobutyl peroxide, octanoyl peroxide, decanoyl peroxide, lauroyl peroxide, 3,3,5-trimethylhexanoyl peroxide, 2,4-dichlorobenzoyl peroxide, and m-toluyl peroxide.

The amount of the polymerization initiator added is preferably 0.1 to 25 parts by weight, more preferably 1 to 20 parts by weight, per 100 parts by weight of the crosslinkable functional group-containing component(s).

<Levelling Agent>

Non-limiting examples of the levelling agents include siloxane compounds such as polyether-modified polydimethylsiloxanes, polyether-modified siloxanes, polyether ester-modified hydroxy group-containing polydimethylsiloxanes, polyether-modified acrylic group-containing polydimethylsiloxanes, polyester-modified acrylic group-containing polydimethylsiloxanes, perfluoropolydimethylsiloxanes, perfluoropolyether-modified polydimethylsiloxanes, and perfluoropolyester-modified polydimethylsiloxanes; fluorine compounds such as perfluoroalkylcarboxylic acids and perfluoroalkyl polyoxyethylene ethanols; polyether compounds such as polyoxyethylene alkyl phenyl ethers, propylene oxide polymers, and ethylene oxide polymers; carboxylates such as coconut oil fatty acid amine salts and gum rosin; ester compounds such as castor oil sulfuric acid esters, phosphoric acid esters, alkyl ether sulfates, sorbitan fatty acid esters, sulfonic acid esters, and succinic acid esters; sulfonate compounds such as alkyl aryl sulfonic acid amine salts and dioctyl sodium sulfosuccinate; phosphate compounds such as sodium lauryl phosphate; amide compounds such as coconut oil fatty acid ethanolamide; and acrylic compounds.

When a levelling agent is used, the amount thereof is preferably 0.001 to 5 wt %, more preferably 0.01 to 1 wt %, still more preferably 0.05 to 0.5 wt % of the solids content of the resin composition for imprinting.

<Solvent>

Non-limiting examples of the solvents include alcohols such as methanol, ethanol, isopropanol, ethylene glycol, diethylene glycol, triethylene glycol, and propylene glycol; ethers such as tetrahydrofuran; ethylene glycol ethers such as ethylene glycol monomethyl ether (methyl cellosolve), ethylene glycol dimethyl ether, ethylene glycol methyl ethyl ether, and ethylene glycol monoethyl ether (ethyl cellosolve); ethylene glycol alkyl ether acetates such as methyl cellosolve acetate and ethyl cellosolve acetate; diethylene glycol dialkyl ethers such as diethylene glycol diethyl ether, diethylene glycol dimethyl ether, diethylene glycol dibutyl ether, and diethylene glycol ethyl methyl ether; diethylene glycol monoalkyl ethers such as diethylene glycol monomethyl ether, diethylene glycol monoethyl ether, and diethylene glycol monobutyl ether; propylene glycol monoalkyl ethers such as propylene glycol monomethyl ether; alkylene glycol monoalkyl ether acetates such as propylene glycol monomethyl ether acetate (PGMEA), propylene glycol monoethyl ether acetate, ethylene glycol monomethyl ether acetate, ethylene glycol monobutyl ether acetate, diethylene glycol monoethyl ether acetate, diethylene glycol monobutyl ether acetate, and 3-methoxybutyl-1-acetate; aromatic hydrocarbons such as toluene and xylene; ketones such as acetone, methyl ethyl ketone, methyl amyl ketone, cyclohexanone, and 4-hydroxy-4-methyl-2-pentanone; and esters such as ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanoate, methyl 3-methoxypropionate, ethyl 3-methoxypropionate, methyl 3-ethoxypropionate, ethyl 3-ethoxypropionate, ethyl acetate, butyl acetate, methyl lactate, ethyl lactate, dimethyl succinate, diethyl succinate, diethyl adipate, diethyl malonate, and dibutyl oxalate. Among these, ethylene glycol ethers, alkylene glycol monoalkyl ether acetates, diethylene glycol dialkyl ethers, ketones, and esters are preferred, with ethyl 3-ethoxypropionate, ethyl lactate, propylene glycol monomethyl ether acetate (PGMEA), diethylene glycol monoethyl ether acetate, and methyl amyl ketone being more preferred. These solvents may be used alone or in combinations of two or more.

The composition may have any solids content, preferably 10 to 85 wt %, more preferably 20 to 80 wt %, still more preferably 30 to 75 wt %. When the solids content falls within the range indicated above, the composition has excellent dispersion stability and imprint properties and can form a film with a sufficient thickness.

The resin composition for imprinting of the present invention may have any viscosity, preferably a viscosity of 0.1 to 100 mPa·s, more preferably 3.0 to 50 mPa·s. When the viscosity falls within the range indicated above, the resin composition has excellent coating properties.

The cured product of the resin composition for imprinting may have any refractive index, preferably a refractive index of 1.62 to 2.0, more preferably 1.65 to 1.9. When the refractive index falls within the range indicated above, optical properties sufficient for optical elements can be maintained.

The cured product of the resin composition for imprinting may have any Abbe number, preferably an Abbe number of 15 to 40, more preferably 20 to 40. When the Abbe number falls within the range indicated above, optical properties sufficient for optical elements can be maintained.

The cured product of the resin composition for imprinting may have any total light transmittance, preferably a total light transmittance of 85% or higher, more preferably 90% or higher, still more preferably 95% or higher. When the total light transmittance falls within the range indicated above, optical properties sufficient for optical elements can be maintained.

The cured product of the resin composition for imprinting preferably has a lower haze value which leads to better optical properties. For example, the haze value is preferably 1% or lower, more preferably 0.5% or lower.

<Mixing Step>

The polysiloxane resin (A), the fine particulate inorganic oxide (B), and optional components to be added as necessary, such as a dispersant, an alkoxysilane compound, and a solvent, may be mixed in any order. The polysiloxane resin, the fine particulate inorganic oxide, and optional components such as a dispersant and an alkoxysilane compound may be added in any order to a solvent. The polysiloxane resin (A) and optional components to be added as necessary, such as a curable resin, a polymerization initiator, and a levelling agent, may be added to a dispersion obtained by dispersing the fine particulate inorganic oxide in a solvent.

<Wet Grinding Step>

When the fine particulate inorganic oxide is used as a dispersion in a solvent, the dispersion may be obtained by a wet grinding step. In the wet grinding step, a mixture of the fine particulate inorganic oxide (B) with a dispersant, an alkoxysilane compound, and a solvent, which are added as necessary, may be wet-ground. Grinding of the fine particulate inorganic oxide and dispersing of the ground product can be performed simultaneously by wet grinding in a solvent. Examples of the wet grinding mill used in the wet grinding step include ball mills and bead mills. Devices having a different mechanism from these mills may also be used. When a bead mill is used as the wet grinding mill, the diameter of the beads is preferably 30 to 100 μm, and the rotational speed is preferably 6 to 12 m/s.

«Method of Producing Imprinted Substrate»

The method of producing an imprinted substrate of the present invention is characterized by including coating a substrate with the resin composition for imprinting, and patterning the coated substrate by nanoimprinting. The method may also include curing a coating film obtained by the patterning.

In the method of producing an imprinted substrate of the present invention, a light transmissive material is selected as at least one of the substrate and/or the template substrate. The material of the substrate is not limited and may be selected according to the intended use. Non-limiting examples include quartz, glass, ceramic materials, deposited films, magnetic films, reflective films, metal substrates such as Ni, Cu, Cr, and Fe, paper, SOG (spin-on-glass), TFT array substrates, PDP electrode plates, conductive substrates such as ITO, insulating substrates, substrates for semiconductor manufacture such as silicon, silicon nitride, polysilicon, silicon oxide, and amorphous silicon, and polymer substrates such as polyethylene, polypropylene, polyester, polyethylenenaphthalate, polycarbonate, polyimide, cycloolefin, polystyrene, polytetrafluoroethylene, PMMA, and ABS resins. The substrate may also have any shape such as a plate or roll shape. Moreover, as described above, a light transmissive or non-light transmissive substrate may be selected according to the template combined or other conditions.

The substrate may be coated with the resin composition for imprinting by any method such as bar coating, spin coating, spray coating, dip coating, nozzle coating, gravure coating, reverse roll coating, die coating, air doctor coating, blade coating, rod coating, curtain coating, knife coating, transfer roll coating, squeeze coating, impregnation coating, kiss coating, calender coating, or extrusion coating.

The coating film may have any thickness, preferably a thickness of 0.005 to 100 μm, more preferably 0.05 to 40 μm, still more preferably 0.1 to 20 μm. When the thickness falls within the range indicated above, the film has excellent imprint properties and maintains sufficient optical properties.

In patterning by nanoimprinting, the resin composition for imprinting may be cured by light or heat while a patterned template (transfer imprint stamp) is pressed onto the substrate coated with the curable resin, thereby transferring the fine structure pattern. After the curing, the template may be removed to prepare an imprinted substrate.

The template may be made of any material. For example, a light transmissive template may be made of silicone, glass, quartz, PMMA, a light transparent resin (e.g., a polycarbonate resin), a transparent metal-deposited film, a flexible film (e.g., polydimethylsiloxane), a photocurable film, a metal film, or other materials. Also, a non-light transmissive template may be made of any material having a predetermined strength. Specific examples include, but are not limited to, ceramic materials, deposited films, magnetic films, reflective films, metal substrates such as Ni, Cu, Cr, and Fe, and substrates such as SiC, silicon, silicon nitride, polysilicon, silicon oxide, and amorphous silicon. The mold may also have any shape and may be either a plate-shaped mold or a roll-shaped mold. Moreover, roll-to-roll film imprinting can be easily performed by using a flexible resin mold.

The pressure for pressing is not limited, and is preferably 0.001 to 10 MPa, more preferably 0.01 to 5 MPa. The pressing time is not limited, and is preferably 0.1 to 30 minutes, more preferably 0.5 to 10 minutes.

Non-limiting examples of the template pattern include wiring patterns, line-and-space patterns, moth-eye patterns, and patterns with cylindrical, conical, truncated conical, polygonal prismatic (e.g., quadrangular prismatic), polygonal pyramidal (e.g., quadrangular pyramidal), or polygonal truncated pyramidal (e.g., quadrangular truncated pyramidal) projections or recesses.

The template used in the method of producing a cured product of the present invention may be one having been subjected to mold release treatment in order to improve separation between the resin composition for imprinting and the template surface. The mold release treatment may be carried out by any method such as by using a surfactant (e.g., a silicone, fluorine, or nonionic surfactant), a silane coupling agent, or fluorine-containing diamond-like carbon.

The coating step may be followed by a solvent drying step depending on the particular resin composition for imprinting. Particularly when a solvent having a high boiling point is used, a drying step may be performed in order to form a smooth coating film and to reduce shrinkage of the film patterned by nanoimprinting.

The resin composition may be cured by any process such as photo curing or heat curing. In the heat curing process, the heating temperature is not limited, and is preferably 60 to 300° C., more preferably 100 to 250° C. A heating temperature of lower than 60° C. may result in curing failure. A heating temperature of higher than 300° C. may spoil the shape of the substrate depending on the material of the substrate. Also, the heating time is not limited, and is preferably 5 to 120 seconds, more preferably 10 to 60 seconds. A heating time shorter than 5 seconds may result in curing failure. A heating time longer than 120 seconds may spoil the shape of the substrate depending on the material of the substrate. In addition, the time required for the process is extended, which is not preferred also from the standpoint of productivity.

In the photo curing process, the dose of light irradiation in the step of irradiating the patterned layer with light in the method of producing a resin composition for imprinting of the present invention is not limited as long as it is sufficiently larger than the irradiation dose required for curing. The irradiation dose required for curing can be determined as appropriate in consideration of the amount of unsaturated bonds consumed in the resin composition for imprinting and the tackiness of the cured film. For example, the irradiation dose is desirably adjusted within the range of 5 mJ/cm$^2$ to 2000 mJ/cm$^2$. The substrate temperature during light irradiation is usually at room temperature, but the substrate may be irradiated with light while being heated for higher reactivity.

Any light may be used to cure the resin composition for imprinting of the present invention, and examples include high energy ionizing radiation, light having a wavelength in the near ultraviolet, far ultraviolet, visible, infrared, or other ranges, and other radiations. As the source of high energy ionizing radiation, for example, electron beams accelerated by accelerators such as Cockcroft-Walton accelerators, Van de Graaff accelerators, linear accelerators, betatrons, and cyclotrons are industrially most convenient and economical. Other radiations such as γ ray, X ray, α ray, neutron, and proton radiations emitted from radioisotopes or atomic furnaces may also be used. Examples of the source of ultraviolet rays include ultraviolet fluorescent lamps, low pressure mercury lamps, high pressure mercury lamps, ultra high pressure mercury lamps, xenon lamps, carbon arc lamps, and solar lamps. Examples of radiations include microwaves and EUV. Additionally, LED, semiconductor laser light, and laser light used in semiconductor microfabrication such as 248 nm KrF excimer laser light and 193 nm ArF excimer laser light may also be suitably used in the present invention. Such light may be monochromatic light or light having a plurality of wavelengths (mixed light).

After the patterning by nanoimprinting and the removal of the template, a curing step may be performed as necessary.

The imprinted substrate of the present invention is characterized by including a substrate, and a projection or recess formed from a cured product of the photocurable composition for imprinting.

The imprinted substrate of the present invention may be suitably used as an optical coating film, an optical component, or a molded product in optical devices, semiconductor devices, display devices, or other devices. Specific examples include organic EL, touch panels, touch sensors, liquid crystal displays, CMOS, solar cells, transistors, light emitting diodes, memories, IC, LSI, CPU, RFID, CCD, printed circuit boards, semiconductor mounted boards, optical waveguides, optical filters, anti-reflection films, lenses, prisms, mirrors, lasers, resonators, PDP, electronic paper, and MEMS.

EXAMPLES

The present invention is described below with reference to examples. The present invention is not limited to the following examples. Hereinafter, the terms "part(s)" and "%" represent "part(s) by weight" and "wt %", respectively, unless otherwise specified.

The chemical agents used in the examples and comparative examples are listed below.
(1) Fine particulate inorganic oxide
  Zirconium oxide (Daiichi Kigenso Kagaku Kogyo Co., Ltd., UEP-50, average primary particle size: 20 nm)
  Titanium oxide (Nippon Aerosil Co., Ltd., P-90, average primary particle size: 13 nm)
(2) Dispersant
  Polymeric dispersant (BYK Japan KK, BYK118)
(3) Alkoxysilane
  3-Methacryloxypropyltrimethoxysilane (Shin-Etsu Chemical Co., Ltd., KBM-503)
  Phenyltrimethoxysilane (Shin-Etsu Chemical Co., Ltd., KBM-103)
(4) Solvent
  Propylene glycol monomethyl ether acetate (Daicel Corporation, PGMEA)
  Methyl isobutyl ketone (Tokyo Chemical Industry Co., Ltd., MIBK)
(5) Curable resin
  Dipentaerythritol hexaacrylate (DPHA) (Shin-Nakamura Chemical Co., Ltd.)
  Fluorene-based epoxy resin (OGSOL EA-0200) (Osaka Gas Chemicals Co., Ltd.)
(6) Polymerization initiator
  Photo radical polymerization initiator (IGM Resins B.V., Omnirad 127)
  Photo radical polymerization initiator (IGM Resins B.V., Omnirad TPO H)
(7) Levelling agent
  Silicone levelling agent (BYK Japan KK, BYK-331)

Synthesis Example 1

3-Methacryloxypropyltrimethoxysilane and phenyltrimethoxysilane were mixed at a molar ratio of 90:10. The mixture was diluted with MIBK to 50 wt %, and water was added in an amount of 3 equivalents relative to the total amount of the alkoxysilanes. A 20 wt % sodium hydroxide aqueous solution was added dropwise in an amount of 0.05 equivalents relative to the total amount of the alkoxysilanes. The mixture was heated at 60° C. for three hours. Water was added to and removed from the reacted solution, and this liquid-liquid separation step was performed three times. To the resulting solution was added sodium sulfate for dehydration. Then, the solution was concentrated in an evaporator to obtain a polysiloxane A. The molecular weight of the polysiloxane A was measured by GPC, and the weight average molecular weight was 3300.

Synthesis Example 2

3-Methacryloxypropylmethyldimethoxysilane and phenyltrimethoxysilane were mixed at a molar ratio of 70:30. The mixture was diluted with MIBK to 50 wt %, and water was added in an amount of 3 equivalents relative to the total amount of the alkoxysilanes. A 20 wt % sodium hydroxide aqueous solution was added dropwise in an amount of 0.05 equivalents relative to the total amount of the alkoxysilanes. The mixture was heated at 60° C. for three hours. Water was added to and removed from the reacted solution, and this liquid-liquid separation step was performed three times. To the resulting solution was added sodium sulfate for dehydration. Then, the solution was concentrated in an evaporator to obtain a polysiloxane B. The molecular weight of the polysiloxane B was measured by GPC, and the weight average molecular weight was 2700.

Synthesis Example 3

3-Methacryloxypropyltrimethoxysilane and diphenylsilanediol were mixed at a molar ratio of 40:60. Ba(OH)$_2$ was added in an amount of 0.05 equivalents relative to the total number of moles of the alkoxysilane and the silanediol. The mixture was heated at 80° C. for three hours. Toluene was added to the reaction solution, and the mixture was concentrated under a reduced pressure of 50 hPa while being heated at 80° C. The reaction solution was diluted with toluene to a solids content of 50 wt %. Then, water was added to and removed from the solution, and this liquid-liquid separation step was performed three times. To the resulting solution was added sodium sulfate for dehydration. Then, the solution was concentrated in an evaporator to obtain a polysiloxane C. The molecular weight of the polysiloxane C was measured by GPC, and the weight average molecular weight was 2300.

Examples 1 to 14 and Comparative Examples 1 to 3

The fine particulate inorganic oxide, dispersant, alkoxysilane compound, and solvent were mixed at a ratio corresponding to the amounts shown in Table 1. Subsequently, the mixture was dispersed with a media disperser (bead mill) to give a fine particulate inorganic oxide dispersion. The bead mill was used under the following processing conditions: a total weight of the mixture charged of 350 g; a bead diameter of 50 μm; a rotational speed of 10 m/sec; and a dispersing time of 180 minutes.

To the fine particulate inorganic oxide dispersion were added the polysiloxane resin, curable resin, polymerization initiator, and levelling agent in the amounts shown in Table 1. The mixture was stirred at room temperature to prepare a resin composition for imprinting.

<Dispersed Particle Size of Fine Particles>

The fine particulate inorganic oxide dispersion was diluted with PGMEA to a particle concentration of 1 wt %. The particle size was measured with Zetasizer Nano ZS available from Malvern.

<Viscosity>

The viscosity at 25° C. of the prepared resin composition for imprinting was measured with a viscometer (Toki Sangyo Co., Ltd, Model B viscometer).

<Refractive Index and Abbe Number>

A silicon substrate was coated with the prepared resin composition for imprinting by spin coating. The solvent was dried at 80° C. for two minutes and exposed to light at 1000 mJ/cm$^2$ for curing, thereby forming a 500 μm-thick coating film. The refractive index and Abbe number of the coating film were measured with a spectroscopic ellipsometer (J.A. Woollam Japan, M-2000C).

<Total Light Transmittance and Haze Value>

A 0.7 mm-thick super-white glass substrate was coated with the prepared resin composition for imprinting by spin coating. The solvent was dried at 80° C. for two minutes and exposed to light at 1000 mJ/cm$^2$ for curing, thereby forming a 3 μm-thick coating film. The total light transmittance and haze value of the coating film were measured with a haze computer (Suga Test Instruments Co., Ltd., HGM-2B) in accordance with JIS K7150.

<Imprint Properties>

A 0.7 mm-thick super-white glass substrate was coated with the prepared resin composition for imprinting by spin coating. The solvent was dried at 80° C. for two minutes to obtain a 3 μm-thick coating film. Next, a polydimethylsiloxane template provided with a L/S pattern having a width of 500 nm and a depth of 500 nm was pressed onto the film at room temperature and a pressure of 10 bar and the film was cured at 1000 mJ/cm$^2$ in Eitre 3 available from Obducat. Then, the pattern was removed to obtain a cured product.

The transferred pattern was observed with SEM, and the imprint properties were evaluated on a four-point scale based on the following criteria. Table 1 shows the results.

Good: the pattern was finely transferred, and good imprint properties were obtained.
Fair: the pattern was transferred, but a deficiency and/or deformation was found.
Poor: the whole or most of the pattern was separated from the substrate upon demolding.
Bad: the mold could not sink in the depth direction and failed to transfer the pattern.

TABLE 1

| | Composition | | Ex. 1 | Ex. 2 | Ex. 3 | Ex. 4 | Ex. 5 | Ex. 6 | Ex. 7 | Ex. 8 | Ex. 9 |
|---|---|---|---|---|---|---|---|---|---|---|---|
| Dispersion | Fine particulate inorganic oxide | UEP-50 | 50.00 | 50.00 | 50.00 | 50.00 | 50.00 | | | | 50.00 |
| | | P-90 | | | | | | 50.00 | 50.00 | 50.00 | |
| | Dispersant | BYK118 | 1.00 | 1.00 | 1.00 | 1.00 | 1.00 | 1.00 | 1.00 | 1.00 | 1.00 |
| | Alkoxysilane | KBM-503 | 10.00 | 10.00 | 10.00 | 10.00 | 10.00 | 10.00 | 8.33 | 10.00 | 10.00 |
| | Solvent | PGMEA | 30.00 | 30.00 | 35.00 | 30.00 | 30.00 | 35.00 | 40.00 | 18.00 | 35.00 |
| Polysiloxane resin | | Siloxane A | 4.00 | 5.00 | 20.00 | | | 16.25 | 66.67 | 100.00 | 15.00 |
| | | Siloxane B | | | | 5.00 | | | | | |
| | | Siloxane C | | | | | 5.00 | | | | |
| Curable resin | | BPFG-A | | | | | | | | | |
| | | DPHA | | | | | | | | | 5.00 |
| Polymerization initiator | | Omnirad 127 | 2.00 | 2.00 | | 2.00 | 2.00 | 2.00 | 2.00 | | 2.00 |
| | | Omnirad TPO H | | | 2.00 | | | | | 2.00 | |
| Levelling agent | | BYK-331 | 0.10 | 0.10 | 0.10 | 0.10 | 0.10 | 0.10 | 0.10 | 0.10 | 0.10 |
| | Total | | 97.10 | 98.10 | 118.10 | 98.10 | 98.10 | 114.35 | 168.10 | 181.10 | 118.10 |
| | Polysiloxane resin/fine particulate inorganic oxide | | 0.280 | 0.300 | 0.600 | 0.300 | 0.300 | 0.525 | 1.500 | 2.200 | 0.500 |
| | Viscosity (mPa · s) | | 10 | 10 | 12 | 10 | 10 | 11 | 13 | 14 | 12 |

TABLE 1-continued

| Evaluation | | | | | | | | | | |
|---|---|---|---|---|---|---|---|---|---|---|
| Dispersed particle size of fine particles (nm) | | 32 | 32 | 33 | 32 | 32 | 40 | 40 | 40 | 33 |
| Refractive index | | 1.8 | 1.78 | 1.7 | 1.78 | 1.78 | 1.9 | 1.7 | 1.65 | 1.7 |
| Abbe number | | 33 | 32 | 29 | 31 | 30 | 19 | 22 | 25 | 28 |
| Total light transmittance (%) | | 95 | 95.4 | 97 | 95.4 | 95.4 | 92.6 | 96.9 | 97.9 | 97 |
| Haze value | | 0.1 | 0.1 | 0.1 | 0.1 | 0.1 | 0.1 | 0.1 | 0.1 | 0.1 |
| Imprint properties | | Good | Good | Good | Good | Good | Good | Good | Good | Good |

| | Composition | | Ex. 10 | Ex. 11 | Ex. 12 | Ex. 13 | Ex. 14 | Comp. Ex. 1 | Comp. Ex. 2 | Comp. Ex. 3 |
|---|---|---|---|---|---|---|---|---|---|---|
| Dispersion | Fine particulate inorganic oxide | UEP-50 P-90 | 50.00 | 50.00 | 50.00 | 50.00 | 50.00 | 50.00 | 50.00 | 50.00 |
| | Dispersant | BYK118 | 1.00 | 1.00 | 4.00 | 1.00 | 1.00 | 1.00 | 1.00 | 1.00 |
| | Alkoxysilane | KBM-503 | 10.00 | 10.00 | 7.00 | 10.00 | 10.00 | 7.00 | 10.00 | 10.00 |
| | Solvent | PGMEA | 20.00 | 70.00 | 30.00 | 35.00 | 35.00 | 55.00 | 20.00 | 35.00 |
| Polysiloxane resin | | Siloxane A | 5.00 | 5.00 | 5.00 | 0.10 | 2.00 | 2.00 | 125.00 | |
| | | Siloxane B | | | | | | | | |
| | | Siloxane C | | | | | | | | |
| Curable resin | | BPFG-A | | | | 20.00 | 20.00 | | | |
| | | DPHA | | | | | | | | 20.00 |
| Polymerization initiator | | Omnirad 127 | 2.00 | 2.00 | 2.00 | 2.00 | 2.00 | 2.00 | 2.00 | |
| | | Omnirad TPO H | | | | | | | | 2.00 |
| Levelling agent | | BYK-331 | 0.10 | 0.10 | 0.10 | 0.10 | 0.10 | 0.10 | 0.10 | 0.10 |
| | Total | | 88.10 | 138.10 | 98.10 | 118.20 | 120.10 | 117.10 | 208.10 | 118.10 |
| | Polysiloxane resin/fine particulate inorganic oxide | | 0.300 | 0.300 | 0.240 | 0.202 | 0.240 | 0.180 | 2.700 | 0.200 |
| | Viscosity (mPa·s) | | 30 | 4 | 8 | 15 | 10 | 9 | 16 | 11 |
| Evaluation | Dispersed particle size of fine particles (nm) | | 32 | 32 | 35 | 35 | 35 | 32 | 35 | 32 |
| | Refractive index | | 1.78 | 1.78 | 1.77 | 1.78 | 1.77 | 1.84 | 1.6 | 1.7 |
| | Abbe number | | 32 | 32 | 31 | 32 | 32 | 34 | 27 | 36 |
| | Total light transmittance (%) | | 95.2 | 95.4 | 95.6 | 95.3 | 95.4 | 94.5 | 98.9 | 97 |
| | Haze value | | 0.1 | 0.1 | 0.1 | 0.1 | 0.1 | 0.1 | 0.1 | 0.1 |
| | Imprint properties | | Good | Good | Good | Good | Good | Bad | Fair | Poor |

Ex.: Example
Comp. Ex.: Comparative Example

As shown in Table 1, the resin compositions for imprinting of Examples 1 to 14 were excellent in both optical properties and imprint properties. Poor imprint properties were exhibited by the resin composition for imprinting of Comparative Example 1 which contained only a small amount of the polysiloxane resin and a large amount of the fine particulate inorganic oxide and the resin composition for imprinting of Comparative Example 2 which contained a large amount of the polysiloxane resin and only a small amount of the fine particulate inorganic oxide. Moreover, the resin composition for imprinting of Comparative Example 3 containing no polysiloxane resin also exhibited poor imprint properties.

The invention claimed is:

1. A resin composition for imprinting, comprising:
(A) a polysiloxane resin represented by the following formula (1):

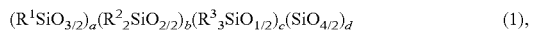

$(R^1SiO_{3/2})_a(R^2{}_2SiO_{2/2})_b(R^3{}_3SiO_{1/2})_c(SiO_{4/2})_d$     (1), wherein $R^1$, $R^2$, and $R^3$ are each independently a hydrogen atom, a hydroxy group, an alkoxy group, a C1-C12 hydrocarbon group, or a C1-C12 substituent having one or more crosslinkable functional groups, with at least one of $R^1$, $R^2$, or $R^3$ being a C1-C12 substituent having one or more crosslinkable functional groups, and when a plurality of $R^1$s, $R^2$s, or $R^3$s are present, they may be different from one another; and a, b, c, and d are numbers satisfying the following conditions: 0.001≤a≤1.00, 0≤b≤0.999, 0≤c≤0.30, 0≤d≤0.30, and a+b+c+d=1.0;

(B) a fine particulate inorganic oxide;
an alkoxysilane compound; and
optionally a curable resin,
wherein a ratio by weight of a sum of the polysiloxane resin (A), the alkoxysilane compound, and the optional curable resin when present, to the fine particulate inorganic oxide (B) is 0.2 to 2.5, and a solid content of the resin composition is 10 to 85 wt %.

2. The resin composition for imprinting according to claim 1,
wherein the crosslinkable functional groups in the C1-C12 substituent are each a (meth)acrylic group, a (meth)acryloxy group, a vinyl group, or an epoxy group.

3. The resin composition for imprinting according to claim 1,
wherein the polysiloxane resin (A) has a weight average molecular weight of 1000 to 5000.

4. The resin composition for imprinting according to claim 1,
wherein the fine particulate inorganic oxide (B) has an average dispersed particle size of 10 to 70 nm.

5. The resin composition for imprinting according to claim 1,
wherein the ratio by weight of a sum of the polysiloxane resin (A), the alkoxysilane compound, and the optional curable resin when present, to the fine particulate inorganic oxide (B) is 0.25 to 1.

6. The resin composition for imprinting according to claim 1,
    wherein the fine particulate inorganic oxide (B) is zirconium oxide or titanium oxide.

7. An imprinted substrate comprising:
    a substrate; and
    a projection or recess formed from a cured product of the resin composition for imprinting according to claim 1.

8. A method of producing an imprinted substrate, the method comprising:
    coating a substrate with the resin composition for imprinting according to claim 1; and
    patterning the coated substrate by nanoimprinting.

* * * * *